(12) United States Patent
Tanaka et al.

(10) Patent No.: US 6,249,462 B1
(45) Date of Patent: Jun. 19, 2001

(54) DATA OUTPUT CIRCUIT THAT CAN DRIVE OUTPUT DATA SPEEDILY AND SEMICONDUCTOR MEMORY DEVICE INCLUDING SUCH A DATA OUTPUT CIRCUIT

(75) Inventors: Koji Tanaka; Jun Nakai; Yasuhiko Tsukikawa; Mikio Asakura, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/557,867

(22) Filed: Apr. 24, 2000

(30) Foreign Application Priority Data

Oct. 28, 1999 (JP) ................................. 11-306602

(51) Int. Cl.[7] ................................................. G11C 16/04
(52) U.S. Cl. ....................................................... 365/189.05
(58) Field of Search ........................ 365/189.05, 189.01, 365/189.09, 189.11

(56) References Cited

U.S. PATENT DOCUMENTS

| | | | |
|---|---|---|---|
| 5,241,502 | 8/1993 | Lee et al. | 365/203 |
| 5,396,128 | * 3/1995 | Dunning et al. | 326/68 |
| 5,703,811 | * 12/1997 | Yoo et al. | 365/189.05 |
| 5,754,480 | * 5/1998 | Sato | 365/189.05 |
| 5,818,258 | * 10/1998 | Choi | 326/83 |
| 5,835,449 | * 11/1998 | Lee | 365/238.5 |
| 5,953,261 | * 9/1999 | Furutani et al. | 365/189.05 |

FOREIGN PATENT DOCUMENTS

| | | |
|---|---|---|
| 4-232690 | 8/1992 | (JP) . |
| 9-205356 | 8/1997 | (JP) . |

* cited by examiner

*Primary Examiner*—Richard Elms
*Assistant Examiner*—Anh Phung
(74) *Attorney, Agent, or Firm*—McDermott, Will & Emery

(57) ABSTRACT

An output buffer includes a pull up transistor of N type field effect to charge a data output terminal by an external power supply potential Vdd in a high level data output operation, and a pull down transistor of N type field effect to discharge the data output terminal to a ground potential Vss in a low level data output operation. The substrate potential of the pull up NMOS transistor is set to a potential of a level higher than the normal case in a high level data output operation. As a result, the output buffer can speedily charge the data terminal in a high level data output operation.

16 Claims, 13 Drawing Sheets

DATA OUTPUT CIRCUIT THAT CAN DRIVE OUTPUT DATA SPEEDILY AND SEMICONDUCTOR MEMORY DEVICE INCLUDING SUCH A DATA OUTPUT CIRCUIT

BACKGROUND OF THE INVENTION

1. Field of the Invention

The present invention relates to data output circuits, particularly to a data output circuit employed as a data output buffer of a semiconductor memory device.

2. Description of the Background Art

As to data output from a semiconductor memory device such as a DRAM (Dynamic Random Access Memory), the potential difference generated by the charge stored in a memory cell corresponding to the stored information is amplified by a sense amplifier or the like and is transmitted through data lines such as bit lines, I/O lines and the like to be subjected to a buffer process at the last stage for output to a data terminal. The transient current handled by the data output circuit is great during this operation. Latchup easily occurs if a P type MOS transistor is used at the output stage. Therefore, the transistor charging/discharging the data terminal is generally formed of an N type MOS transistor.

FIG. 21 is a block diagram showing a structure of a data output circuit 500 which is one example of the conventional art employed in a semiconductor memory device.

Data output circuit 500 outputs to a data terminal 510 digital data of the two states of a high level (simply referred to as H level hereinafter) and a low level (simply referred to as L level hereinafter). The potential level of data output terminal 510 is set to an external power supply potential Vdd when data output of an H level is designated, and set to a ground potential Vss when data output of an L level is designated.

Data output circuit 500 includes an output buffer 580 to supply external power supply potential Vdd or ground potential Vss to data terminal 510.

Output buffer 580 includes a pull up transistor QNa electrically coupled between external power supply potential Vdd and data terminal 510, having a gate coupled to a node Nb to output data of an H level, and a pull down transistor QNb electrically coupled between ground potential Vss and data terminal 510, and having a gate coupled to a node Nc to output data of an L level.

Data output circuit 500 further includes an H level data output control circuit 110 providing to node Nb a boosted potential that allows pull up transistor QNa to attain a deep ON state when H level data output is designated, an L level data output control circuit 140 supplying to node Nc a potential to turn pull down transistor QNb on when L level data output is designated, and an output potential retain circuit 160 to maintain the potential level of node Nb at a level of at least a constant value when H level data is output.

H level data output control circuit 110 includes a boosting circuit 120 responsive to control signals φ1 and φ2 to output a boosted potential higher than an internal power supply potential Vcc to node Na when H level data is output, and a potential switch circuit 125 responsive to control signal φ2 to set the potential level of node Nb to either the potential level of node Na or ground potential Vss.

L level data output control circuit 140 includes a level conversion circuit 150 to execute level conversion of a control signal φ3, and an inverter 155 responsive to an output of level conversion circuit 150 to output either external power supply potential Vdd or ground potential Vss to node Nc.

Control signal φ2 is rendered active (L level) when output of H level data is designated. Control signal φ3 is rendered active (L level) when output of L level data is designated. Control signal φ1 is rendered active (H level) to activate boosting circuit 120 prior to the output of H level data.

According to the above structure, boosted potential (>Vdd) from boosting circuit 120 is output to node Nb whereas ground potential Vss is output to node Nc in an H level data output operation. Therefore, pull up transistor QNa attains a deep ON state, and pull down transistor QNb is turned off. As a result, data terminal 510 is charged to the level of external power supply potential Vdd.

In an L level data output operation, the potential of node Nc is set to the level of external power supply potential Vdd, and the potential level of node Nb is set to ground potential Vss. In this case, pull down transistor QNb is turned on and pull up transistor QNa is turned off. Therefore, data terminal 510 is discharged by transistor QNb, so that the potential level thereof corresponds to ground potential Vss.

By controlling the gate potential of two N type MOS transistors corresponding to the pull up transistor and the pull down transistor forming output buffer 580, data of either an H or L level can be output to data terminal 510.

From the standpoint of ensuring transistor breakdown voltage corresponding to increase in the integration density of circuitry and from the standpoint of lowering power consumption postulating drive by batteries, the need arises for a semiconductor memory device to operate at a low voltage level. A lower operating voltage causes reduction in the current drivability of the N type MOS transistor. Increase in speed of the data output circuit has become a critical issue in accordance with the demand for reduction in the operating voltage level.

FIG. 22 is a sectional view of a structure of an output buffer 580 of conventional art.

Referring to FIG. 22, pull up transistor QNa and pull down transistor QNb included in an output buffer 580 are provided at a P type well 530 on a P type substrate region 520. Substrate potential Vsub is applied to P well 530 through a contact 532. Substrate potential Vsub is generally a negative potential from the standpoint of preventing latchup.

Pull up and pull down transistors QNa and QNb are provided at the common P type well 530. Pull up transistor QNa includes a gate electrode 534a connected to node Nb, an n channel region 538a connected to data terminal 510 and an n channel region 536a coupled to external power supply potential Vdd, corresponding to source/drain electrodes. Similarly, pull down transistor QNb includes a gate electrode 534b connected to node Nc, and an N channel region 538b coupled to ground potential Vss and an N channel region 536b connected to data terminal 510, corresponding to source/drain electrodes.

In the conventional structure shown in FIG. 22, the charging speed of data terminal 510 by pull up transistor QNa in the output operation of H level data has become an issue.

In an N type MOS transistor, the substrate effect occurs according to the level difference between the source potential (potential level of data terminal 510 for pull up transistor QNa) and the substrate potential (potential level of P type well 530 for pull up transistor QNa) to result in a larger of threshold voltage Vth of the transistor. Therefore, when charging of data terminal 510 is initiated in an H level data output operation, the current drivability of transistor QNa is degraded due to the substrate effect caused by the boost of the source potential. There was a problem that data terminal 510 cannot be charged speedily depending upon reduction in the source-drain current. In order to increase the current drivability to speed up H level data output under such circumstances, a transistor of a large size must be provided as pull up transistor QNa. This will induce increase of the layout area.

In an H level data output operation, the gate potential of pull up transistor QNa, i.e. the potential level of node Nb must be boosted sufficiently. It has become difficult to obtain a sufficient boosted level by boosting circuit 120 in the case of operation at a low voltage. A boosting circuit includes a capacitor for boosting in order to store charge used for boosting. When this capacitor is formed of an MOS capacitor, the usage efficiency of the capacitance of the boosting capacitor is degraded since the effect of threshold voltage Vth becomes greater in accordance with reduction of the voltage level. This causes the aforementioned problem.

SUMMARY OF THE INVENTION

An object of the present invention is to provide a data output circuit that can speedily execute high level driving of output data.

Another object of the present invention is to provide a semiconductor memory device including a data output circuit that can speedily execute high level driving of output data.

According to an aspect of the present invention, a data output circuit to output a data signal having the two states of a high level and a low level includes a buffer circuit, a high level data output control circuit, a low level data output control circuit, and a substrate potential switch circuit.

The buffer circuit sets the potential level of the data output node according to the potential level of first and second nodes. The buffer circuit includes a pull up transistor which is an N type field effect transistor, electrically coupled between a first potential corresponding to a high level and a data output node, and having a gate coupled to the first node, and a pull down transistor which is an N type field effect transistor electrically coupled between a second potential corresponding to the low level and the data output node, and having a gate coupled to the second node. The high level data output control circuit provides a potential that can turn the pull up transistor on to the first node when high level data is output. The low level data output control circuit provides a potential that can turn on the pull down transistor to the second node when low level data is output. The substrate potential switch circuit supplies a substrate potential to the pull up transistor, and outputs a first substrate potential in an operation other than a high level data output operation, and provides a second substrate potential higher than the first substrate potential when in a high level data output operation.

According to another aspect of the present invention, a data output circuit to output a data signal having the two states of a high level and a low level includes a buffer circuit, a high level data output control circuit, a low level data output control circuit, and a potential level retain circuit.

The buffer circuit sets the potential level of a data output node according to the potential level of first and second nodes. The buffer circuit includes a pull up transistor which is an N type field effect transistor electrically coupled between a first potential corresponding to the high level and the data output node, and having a gate coupled to the first node, and a pull down transistor which is an N type field effect transistor electrically coupled between a second potential corresponding to the low level and the data output node, and having a gate coupled to the second node. The high level data output control circuit provides a boosted potential higher than the first potential to the first node when in a high level data output operation. The high level data output control circuit includes a boosted potential generation circuit providing a boosted potential to a boosting node according to the signal level of a control signal rendered active when in a high level data output operation, and a voltage switch circuit electrically coupling either the boosting node or the power supply node that supplies the second potential to the first node according to the signal level of the control signal. The low level data output control circuit provides a potential that can turn on the pull down transistor to the second node when in a low level data output operation. The potential level retain circuit maintains the potential of the boosting node at a level of at least a predetermined level when in a high level data output operation.

According to a further aspect of the present invention, a semiconductor memory device for storing a data signal having the two states of a high level and a low level includes a memory cell array, and a data output circuit.

The memory cell array includes a plurality of memory cells arranged in a matrix. The data output circuit provides to a data output node a potential of a level according to the state of signal data read out from a selected one of a plurality of memory cells. The data output circuit includes a buffer circuit, a high level data output control circuit, a low level data output control circuit, and a substrate potential switch circuit.

The buffer circuit sets the potential level of the data output node according to potential levels of first and second nodes. The buffer circuit includes a pull up transistor which is an N type field effect transistor electrically coupled between a first potential corresponding to the high level and the data output node, and having a gate coupled to the first node, and a pull down transistor electrically coupled between a second potential corresponding to the low level and the data output node, and having a gate coupled to the second node. The high level data output control circuit potential that can turn said pull up transistor on to the first node when in a high level data output operation. The low level data output control circuit provides a potential that allows the pull down transistor to be turned on to the second node when in a low level data output operation. The substrate potential switch circuit supplies a substrate potential to the pull up transistor, and outputs a first substrate potential when in an operation other than the high level data output operation, and provides a second substrate potential higher than the first substrate potential when in a high level data output operation.

The main advantage of the present invention is that, by setting the substrate potential of the pull up N type field effect transistor at a high level in a high level data output operation, the substrate effect is alleviated when in a high level data output operation to prevent increase of the threshold voltage of the pull up transistor. As a result, a data output circuit is provided that prevents reduction of the current divability of the pull up transistor to allow output of high level data speedily even in a high level data output operation.

Even in the case where leakage current or the like is generated during output of high level data to cause reduction of the potential level of the boosting node in the data output circuit, current can be supplied to the boosting node by the potential level retain circuit to restore the potential level. As a result, high level data can be output more stably.

By the provision of a data output circuit that has the substrate potential of the pull up transistor set at a high level in a high level data output operation, the substrate effect during a high level data output operation can be alleviated to prevent increase of the threshold voltage of the pull up transistor. As a result, a semiconductor memory device is provided that can prevent reduction of the current drivability of a pull up transistor and that allows output of high level data speedily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
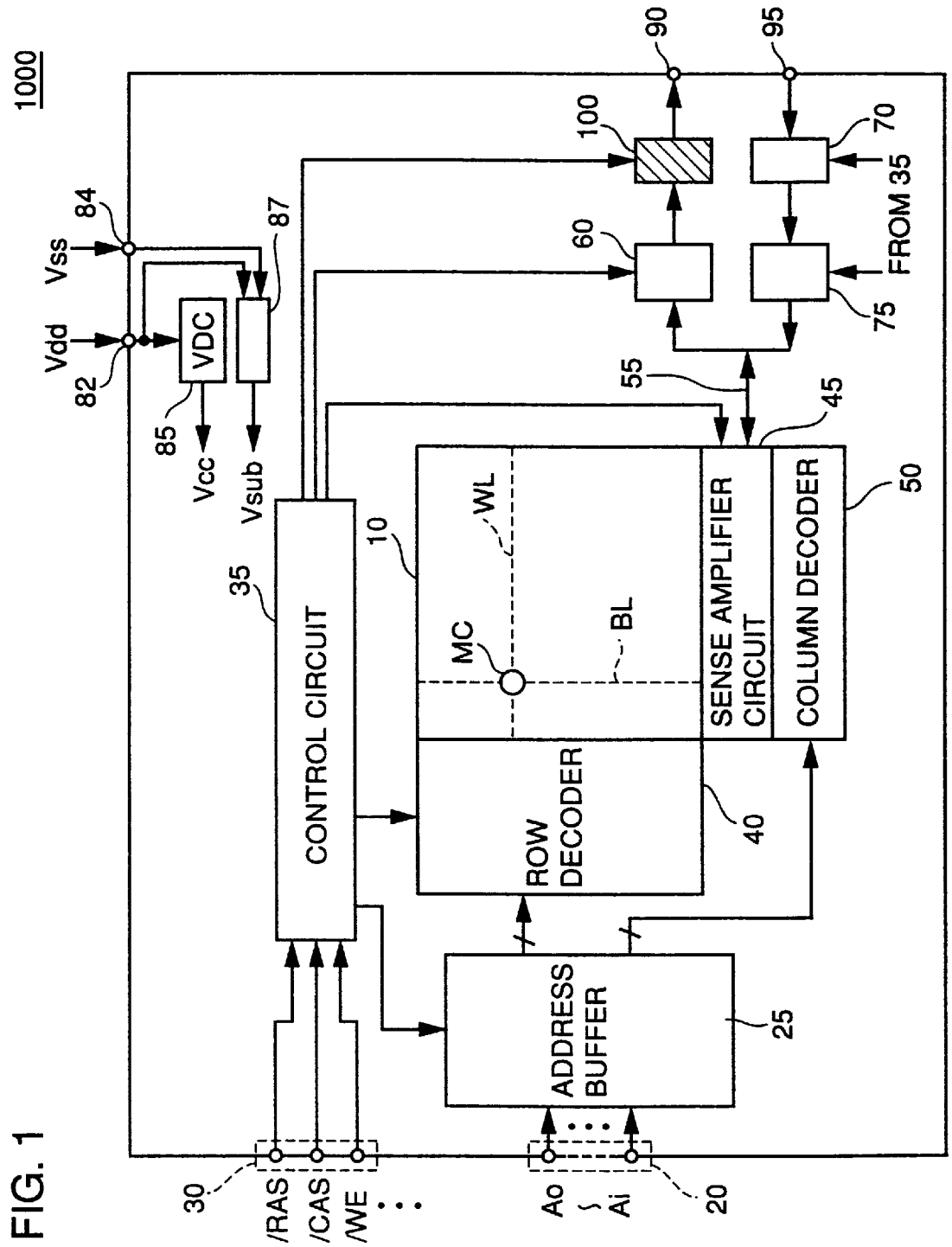
FIG. 1 is a block diagram showing an entire structure of a semiconductor memory device 1000 including a data output circuit according to a first embodiment of the present invention.

Embodiments of the present invention will be described in detail hereinafter with reference to the drawings. In the drawings, the same reference characters denote the same or corresponding components.

First Embodiment

Referring to FIG. 1, semiconductor memory device 1000 includes a memory cell array 10 with a plurality of memory cells arranged in a matrix. In memory cell array 10, a word line is provided corresponding to each row of memory cells, and a bit line is provided corresponding to each column of memory cells. In FIG. 1, one of the plurality of memory cells arranged in a matrix is typically indicated as MC, and arrangement of a word line WL and a bit line BL corresponding to memory cell MC is shown.

Semiconductor memory device 1000 further includes an address input terminal 20 receiving each bits A0–Ai (i: natural number) of an address signal to select a row and column of memory cells, a control signal input terminal 30 receiving control signals of a row address strobe signal/RAS, a column address strobe signal/CAS, a write enable signal/WE, and the like, a control circuit 35 receiving control signals applied to control signal input terminal 30 to control the read, write, refresh operations of the entire semiconductor memory device 1000, and an address buffer 25 receiving bits A0–Ai of an address signal to generate an internal address signal.

The internal address signal output by address buffer 25 is transmitted to a row decoder 40 and a column decoder 50, whereby selection of a row and column of memory cells is executed in response to the internal address signal.

Semiconductor memory device 1000 further includes a sense amplifier circuit 45 to transfer data with a column of memory cells selected by column decoder 50 and executing amplification of the readout data, an I/O line 55 transmitting data with sense amplifier circuit 45, a preamplifier 60 for amplifying the potential difference generated at I/O line 55, and data output circuit 100 responsive to the data amplified by preamplifier 60 to output data of an H/L level to a data output terminal 90.

Semiconductor memory device 1000 further includes an input buffer 70 receiving the write data applied to data input terminal 95, and a write driver 75 to write the data transmitted to input buffer 70 into a memory cell through I/O line 55.

FIG. 1 shows a structure in which data input terminal 95 and data output terminal 90 are arranged independently. Alternatively, a global I/O line that can transmit read data and write data in common can be provided to share the data input terminal and the data output terminal.

In data readout, the data stored in the memory cell selected by row decoder 40 and column decoder 50 is amplified by sense amplifier circuit 45 and transmitted through I/O line 55. The data transmitted through I/O line 55 is amplified by preamplifier 60. In response to the output of preamplifier 60, data output circuit 100 provides data of an HIL level to data output terminal 90.

Semiconductor memory device 1000 further includes a power supply terminal 82 receiving an external power supply potential Vdd, and a power supply terminal 84 receiving ground potential Vss. By external power supply potential Vdd and ground potential Vss input through the power supply terminals, an internal power supply potential Vcc is generated by a voltage-down circuit (VDC) 85. Also, a substrate potential Vsub applied to the P type substrate is generated by a substrate potential generation circuit 87. From the standpoint of preventing latchup, substrate potential Vsub is generally a negative potential.

Figure 2:
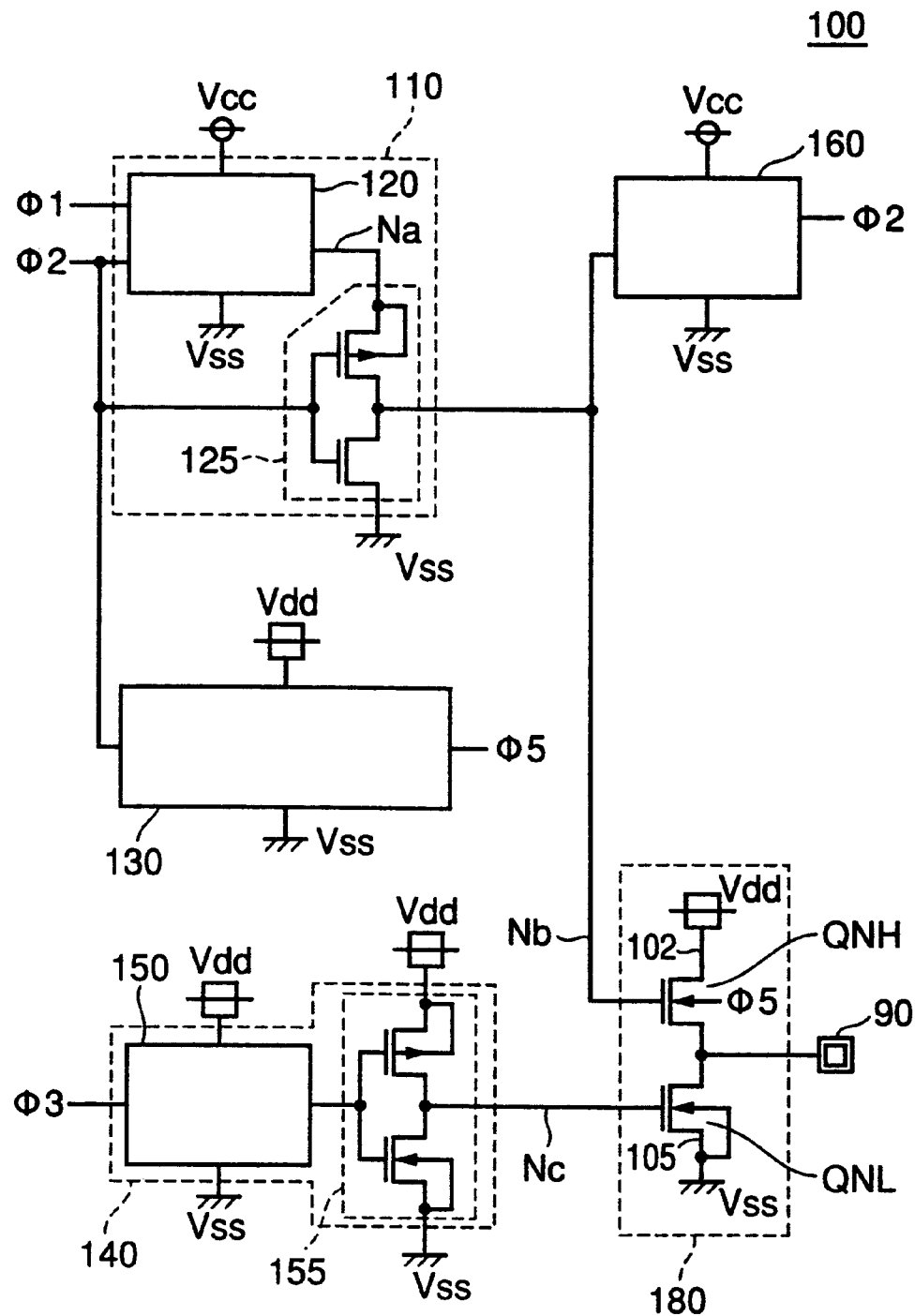
FIG. 2 is a block diagram showing an entire structure of a data output circuit 100.

Referring to FIG. 2, data output circuit 100 sets the potential level of data output terminal 90 to either the level of external power supply potential Vdd or ground potential Vss according to a control signal φ2 rendered active (L level) during the period of designation of H level data output and a control signal φ3 rendered active (L level) during the period of designation of L level data output.

Data output circuit 100 includes an output buffer 180 to charge/discharge data output terminal 90 by either an external power supply 102 or a ground line 105 according to the potential levels of nodes Nb and Nc. Output buffer 180 includes a pull up transistor QNH having a gate coupled to node Nb, and electrically coupled between external power supply 102 and data output terminal 90, and a pull down transistor QNL having a gate coupled to node Nc, and electrically coupled between data output terminal 90 and ground line 105. As described previously, an N type field effect transistor such as N type MOS transistor is employed for both pull up transistor QNH and pull down transistor QNL in order to avoid generation of latchup in data output.

Data output circuit 100 further includes an H level data output control circuit 110 to output to node Nb a potential to turn on pull up transistor QNH when output of H level data is designated, an L level data output control circuit 140 to output a potential of a level to node Nc to turn pull down transistor QNL on when output of L level data is designated, a boosted potential retain circuit 160 to retain node Nb at a potential level of at least a constant level in an H level data output, and a substrate potential switch circuit 130 to switch a substrate potential of pull up transistor QNH during the period where output of H level data is designated.

The structure of each circuit will be described in detail hereinafter.

Figure 3:
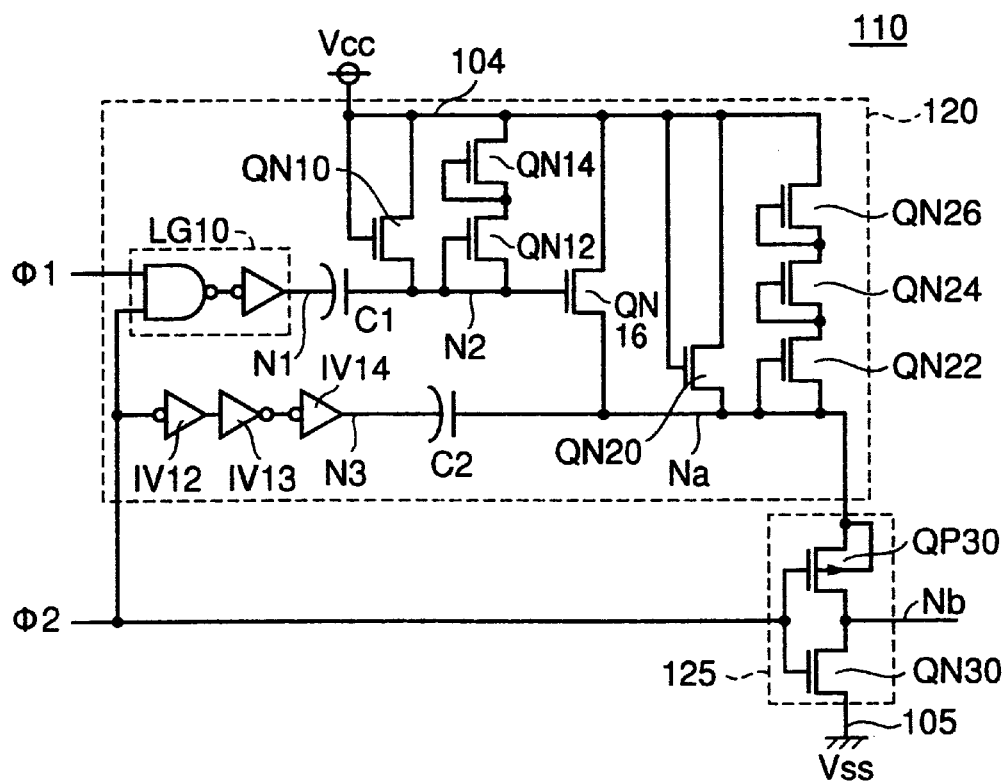
FIG. 3 is a circuit diagram showing a structure of an H level data output control circuit 110.

Referring to FIG. 3, H level data output control circuit 110 includes a boosting circuit 120 to output a boosted potential to a node Na, and a potential switch circuit 125 responsive to control signal φ2 to switch the potential level of node Nb.

Boosting circuit 120 includes a logic circuit LG1O to output the result to node N1 according to control signals φ1 and φ2, a boosting capacitor C1 connected between nodes N1 and N2, a transistor QN10 to precharge node N2 in advance, and diode-connected transistors QN12 and QN14 with the direction from node N2 towards an internal power supply 104 as the forward direction.

Boosting circuit 120 further includes a group of inverters IV12–IV14 to transmit an inverted signal of control signal φ2 to node N3, a boosting capacitor C2 connected between nodes N3 and Na, a transistor QN16 having a gate connected to node N2, and provided to electrically couple internal power supply 102 and node Na, a transistor QN20 provided to precharge node Na in advance, and diode-connected transistors QN22–QN26 with the direction from node Na towards internal power supply 104 as the forward direction.

Control signal φ1 is rendered active (H level) prior to activation of control signal φ2.

Figure 5:
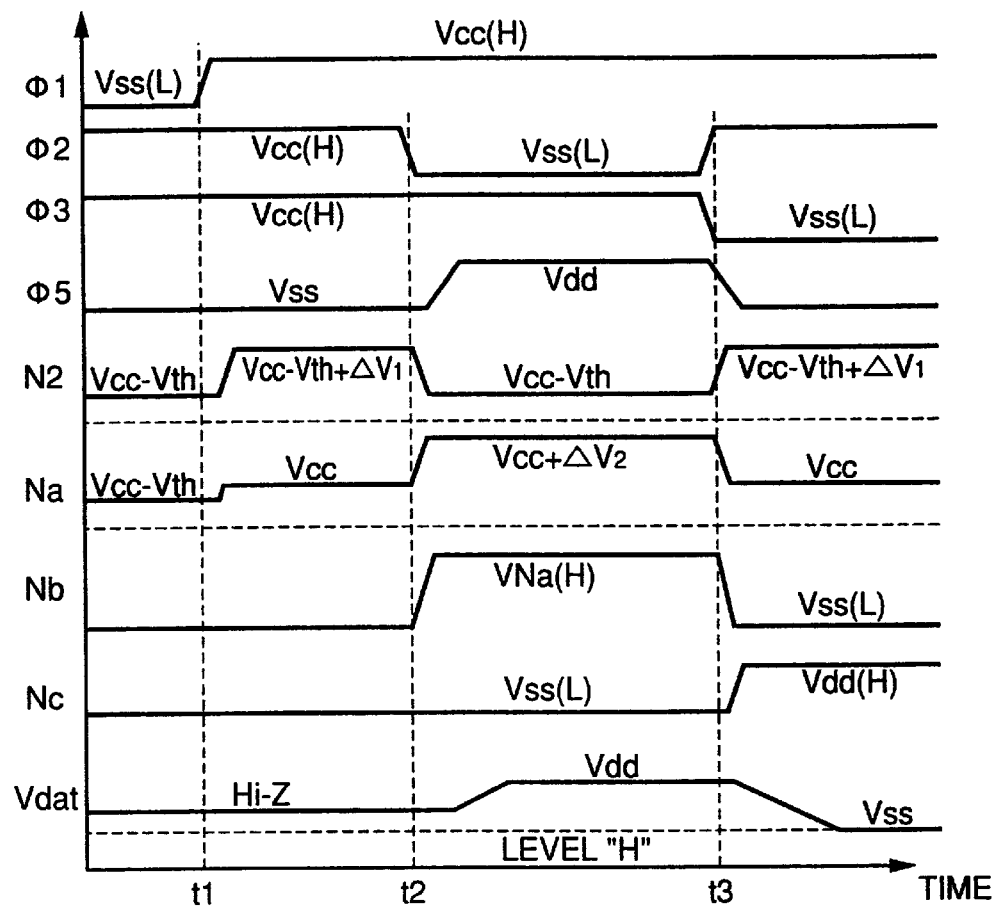
FIG. 5 is a timing chart to describe an operation of data output circuit 100.

The operation of boosting circuit 120 will be described with reference to the timing chart of FIG. 5 representing the operating waveform of each component in data output circuit 100.

At time t1, control signal φ1 is rendered active (H level) prior to activation of control signal φ2.

Before time t1 when control signal φ1 is rendered active, node N2 is precharged to the level of Vcc−Vth (Vth : threshold voltage of N type MOS transistor) by transistor QN10, and node Na is precharged similarly to the level of Vcc−Vth by transistor QN20. Since nodes N1 and N3 are at the potential level of Vss at this timing, charge is stored in boosting capacitors C1 and C2.

In response to activation of control signal φ1, the potential of node N1 is driven to an H level (Vcc) from an L level (Vss). The potential of node N3 corresponds to the inverted state of control signal φ2, and is still at the L level (Vss).

In response to transition of the potential level of node N1 from Vss to Vcc, the potential of node N2 is boosted by the charge stored in boosting capacitor C1 from internal power supply potential Vcc. The potential level is boosted up to Vcc−Vth +ΔV1 (ΔV1: boosted voltage by boosting capacitor C1). Accordingly, transistor QN16 attains a deep ON state, and the potential level of node Na is boosted from the precharged level of Vcc−Vth to the level of Vcc.

At time t2, control signal φ2 to output H level data is rendered active. In response, the potential level of node N1 is driven to an L level (Vss), and the potential level of node N3 is driven to the level of Vcc from the level of Vss. This causes the potential level of node N2 to be lowered again to the precharged level of Vcc−Vth. In contrast, the potential level of node Na is boosted to the level of Vcc+ΔV2 by the charge stored in boosting capacitor C2. Thus, boosted potential Vcc+ΔV2 (ΔV2: boosted voltage by boosting capacitor C2)is supplied to node Na during the activation period of control signal φ2.

When control signal φ2 is rendered inactive (H level) at time t3, the potential level of node N1 is driven to the level of Vcc, and the potential level of node N3 is driven to the L level (Vss level). In response, the potential levels of nodes N2 and Na are driven to the levels of Vcc−Vth +ΔV1 and Vcc, respectively, similar to the transition at time t1.

According to the above-described structure, the potential level of node Na is set to the boosted level Vcc +ΔV2 during the activation period of control signal φ2.

Referring to FIG. 3 again, potential switch circuit 125 includes a P type MOS transistor QP30 electrically coupled between nodes Na and Nb, and an N type MOS transistor QN30 electrically coupled between node Nb and ground line 105. Control signal φ2 is applied to the gates of transistors QP30 and QN30.

Voltage switch circuit 125 transmits to node Nb the boosted potential supplied to node Na in response to transistor QP30 turned on during the activation period (L level) of control signal φ2. During the inactivation period (H level) of control signal φ2, potential switch circuit 125 transmits ground potential Vss to node Nb in response to transistor QN30 being turned on.

Figure 4:
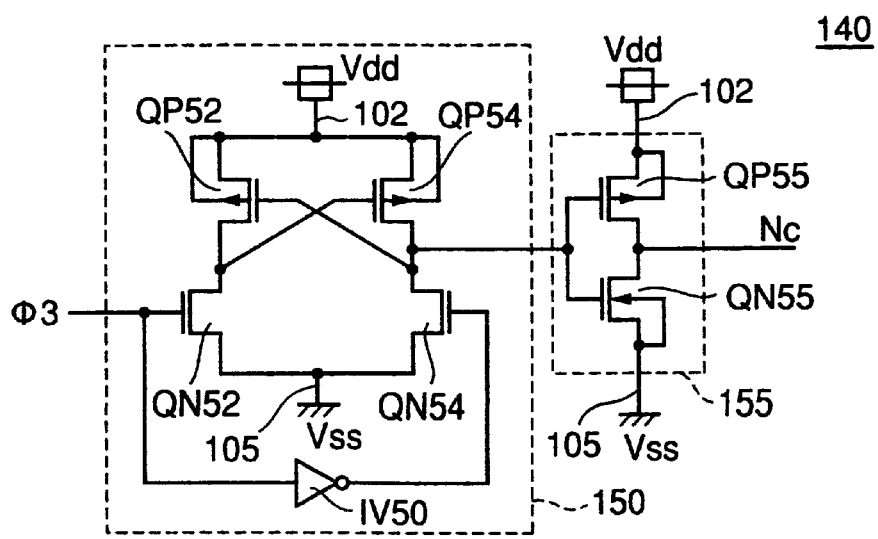
FIG. 4 is a circuit diagram showing a structure of an L level data output control circuit 140.

Referring to FIG. 4, L level data output control circuit 140 includes a level conversion circuit 150 to convert the level of control signal φ3, and an inverter 155 inverting the output of level conversion circuit 150 to provide either external power supply potential Vdd or ground potential Vss to node Nc.

Level conversion circuit 150 includes an inverter IV50 providing the inverted version of control signal φ3, and transistors QP52, QP54, QN52 and QN54 receiving control signal φ3 and an inverted signal thereof.

Level conversion circuit 150 outputs external power supply potential Vdd and ground potential Vss when control signal φ3 is inactive (H level: Vcc) and active (L level: Vss), respectively.

Inverter 155 includes a P type MOS transistor QP55 provided to electrically couple external power supply 102 and node Nc, and an N type MOS transistor QN55 provided to electrically couple node Nc and ground line 105. The output of level conversion circuit 150 is supplied to the gates of transistors QP55 and QN55.

By the above-described structure, control signal φ3 having the amplitude of the level of ground potential Vss to internal power supply potential Vcc can be converted to the amplitude level of external power supply potential Vdd to ground potential Vss to provide an inverted output to node Nc. Accordingly, the potential level of node Nc is set to external power supply potential Vdd during an activation period (L level) of control signal φ3, and otherwise to the level of ground potential Vss.

Figure 6:
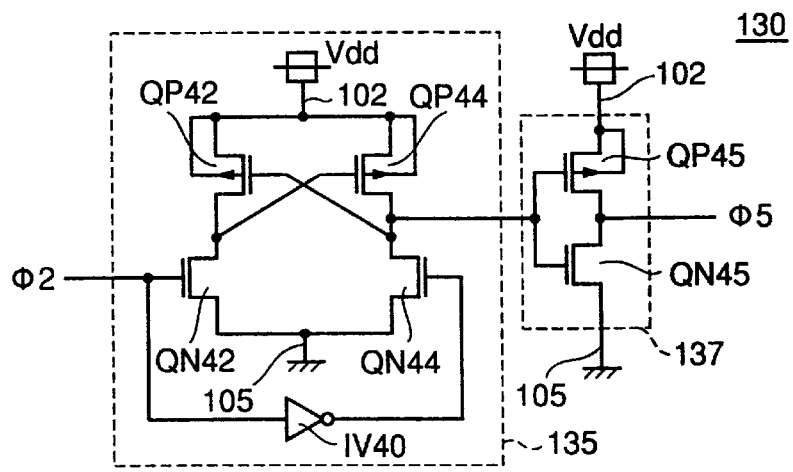
FIG. 6 is a circuit diagram showing a structure of a substrate potential switch circuit 130.

Referring to FIG. 6, substrate potential switch circuit 130 includes a level conversion circuit 135 and an inverter 137. Level conversion circuit 135 has a structure similar to that of level conversion circuit 150 described with reference to FIG. 4. Either external power supply potential Vdd or ground potential Vss is output according to control signal φ2 having an amplitude of the level of internal power supply potential Vcc to ground potential Vss.

Inverter 137 includes transistors QP45 and QN45 connected in series between external power supply 102 and ground line 105. Transistors QP45 and QN45 receive the output of level conversion circuit. 135 at their gates. A control signal φ5 is output from the node to which the drains of transistors QP45 and QN45 are coupled. Therefore, control signal φ5 is an inverted version of control signal φ2 with the amplitude-level converted.

Referring to FIG. 5 again, control signal φ5 is set to the level of Vss during the inactive period of control signal φ2, and set to the level of external power supply potential Vdd during the active (L level) period of control signal φ2, i.e., during the output period of H level data. When control signal φ2 is rendered inactive (H level) again and followed by output of L level data, control signal φ5 attains the level of Vss. Control signal φ5 is applied as the substrate potential of pull up transistor QNH in output buffer 180.

According to the above-described H level data output control circuit 110 and L level data output control circuit 140, the potential levels of nodes Nb and Nc are controlled, and the potential level Vdat of data output terminal 90 is set to an H level (external power supply potential Vdd) and to an L level (ground potential Vss) in response to activation of control signal φ2 and control signal φ3, respectively. When control signals φ2 and φ3 are both at an inactive state (H level), data output terminal 90 is set to a high impedance state (Hi–Z) since transistors QNH and QNL in output buffer 180 are both off.

Figure 7:
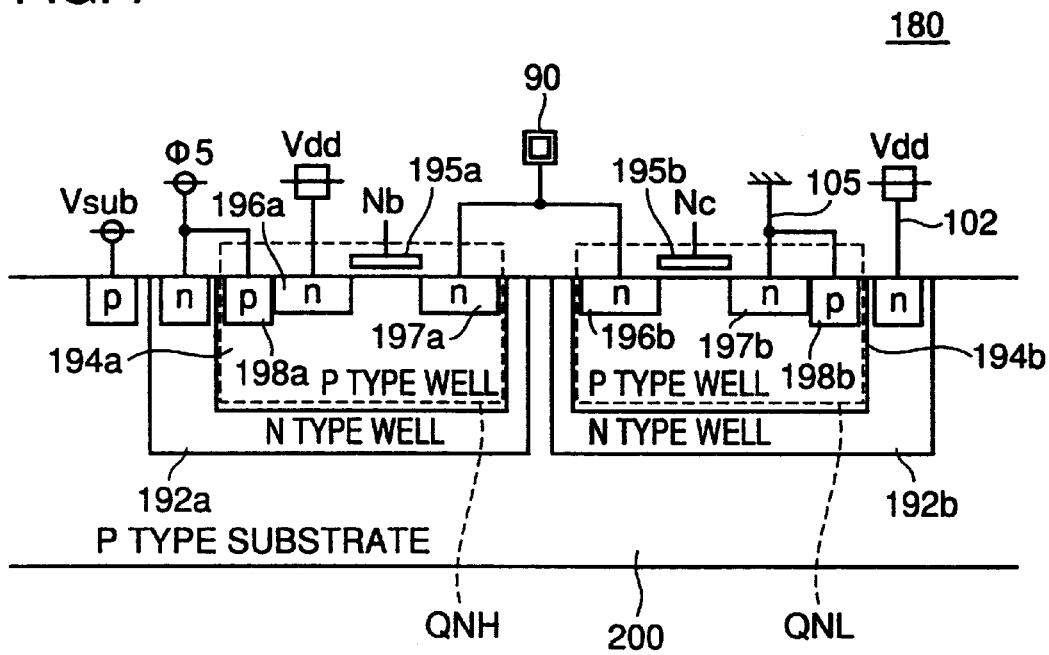
FIG. 7 is a sectional view of output buffer 180 to describe an example of a structure thereof.

Referring to FIG. 7, pull up transistor QNH is arranged on a P type well 194a isolated from P type substrate region 200 by an N type well 192a.

Pull up transistor QNH includes a gate electrode 195a connected to node Nb, and an n channel region 197a connected to data terminal 90 and an n channel region 196a coupled to external power supply potential Vdd, corresponding to source/drain.

Control signal φ5 output from substrate potential switch circuit 130 is applied to P type well 194a via a body contact 198a.

The substrate potential of pull up transistor QNH is set to external power supply potential Vdd when H level data is output, and set to ground potential Vss otherwise. By switching the substrate potential of transistor QNH to a high level in an H level data output operation, increase of threshold voltage Vth caused by the substrate effect can be suppressed even if the potential level of n channel region 197a corresponding to the source of transistor QNH is boosted.

As a result, an output current (source-drain current of transistor QNH) of a greater flow can be supplied by a pull up transistor QHN of the same size in an H level data output operation. Therefore, the problem of inducing reduction of the output speed caused by the substrate effect in an H level data output operation is solved. Data can be output speedily without having to increase the transistor size.

In FIG. 7, the substrate potential (H level potential of control signal φ5) corresponds to external power supply potential Vdd in the H level data output operation. This potential level can be selected arbitrarily within a range in which a PN junction between P type well 194a and the adjacent n type region is not turned on. In the present embodiment, the H level of control signal φ5 is set to correspond to Vdd taking into consideration the fact that N channel region 196a corresponding to the drain of transistor QNH is coupled to external power supply potential Vdd.

In order to electrically isolate P type well 194a from P type substrate region 200, a potential of a selected level is applied to N type well 192a so that the PN junction between P type well 194a and N type well 192a and between P type substrate region 200 and N type well 192a is not turned on.

In the example of FIG. 7, P type well 194a is electrically isolated from P type substrate region 200 by applying control signal φ5 similar to that of P type well 194a to N type well 192a.

Since the potential level of data output terminal 90 is reduced to the level of ground potential Vss when L level data is output, the L level of control signal φ5 must be selected within a range in which a PN junction between P type well 194a and n channel 197a is not turned on. Therefore, the L level potential of control signal φ5 is set to the level of ground potential Vss in the first embodiment.

In other words, the H level potential and L level potential of control signal φ5 can be set arbitrarily within the above-described range.

In FIG. 7, pull down transistor QNL is formed on independent P type well 194b that is electrically isolated from P type substrate region 200.

Pull down transistor QNL includes a gate electrode 195b connected to node Nc, an n channel region 196b corresponding to a drain arranged on P type well 190b and connected to data output terminal 90 and an n channel region 197b connected to ground line 105, and corresponding to a source. Ground potential Vss is applied to P type well 194b via body contact 198b.

External power supply potential Vdd is applied to N type well 192b in order to prevent the PN junction from being turned on.

Figure 8:
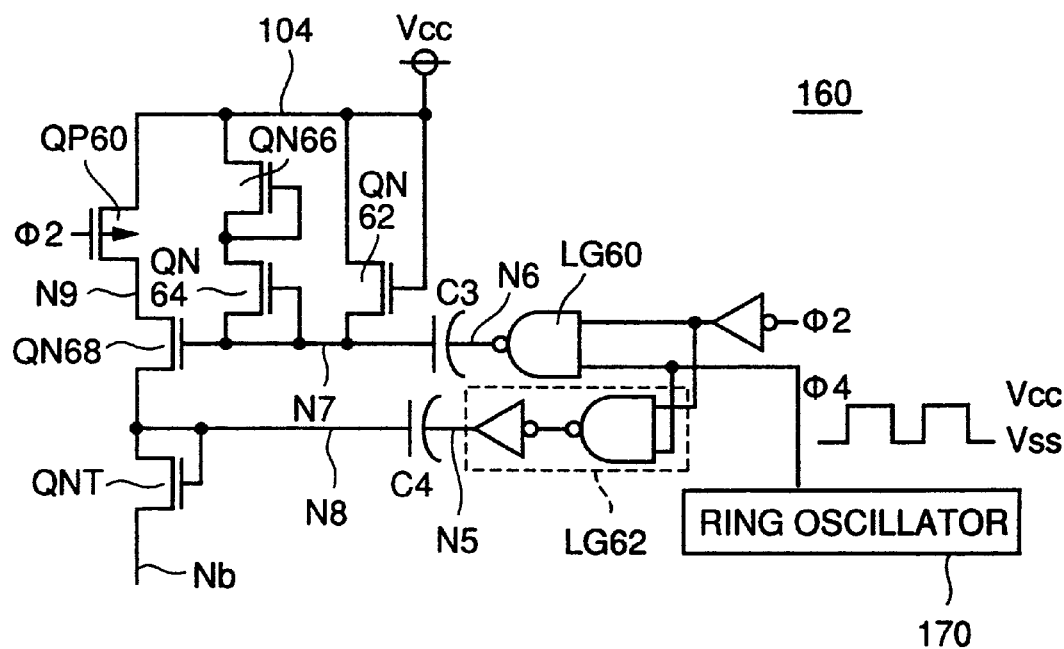
FIG. 8 is a circuit diagram showing a structure of a boosted potential retain circuit 160.

FIG. 8 is a circuit diagram showing a structure of boosted potential retain circuit 190.

Referring to FIG. 8, boosted potential retain circuit 160 includes a ring oscillator 170.

Ring oscillator 170 provides a pulsive signal of a constant frequency having an amplitude of ground potential Vss to internal power supply potential Vcc as a control signal φ4.

Boosted potential retain circuit 160 further includes a logic gate LG60 with control signal φ4 and an inverted signal of control signal φ2 as the 2-input to provide a NAND logical operation result to node N6, and a logic circuit LG62 providing to node N5 the AND logical operation result of control signal φ4 and an inverted signal of control signal φ2.

When control signal φ2 is at an inactive state (H level), nodes N5 and N6 are both fixed at the L level (Vss level). When control signal φ2 is at an active state (L level), a signal of a phase identical to that of control signal φ4 is output to node N5 and an inverted signal of control signal φ4 is output to node N6.

Boosted potential retain circuit 160 further includes a boosting capacitor C3 coupled between nodes N6 and N7, a precharge transistor QN62 connected between an internal power supply 104 and node N7, diode-connected transistors QN64 and QN66 with the direction from node N7 towards internal power supply 104 as the forward direction, and a P type transistor QP60 electrically coupled between node N9 and internal power supply 104, receiving control signal φ2 at its gate. Therefore, node N7 is precharged to the level of Vcc−Vth when the potential level of node N6 is at the Vss level, and boosted in a pulsive manner according to control signal φ4 when control signal φ2 is active.

Boosted potential retain circuit 160 further includes a boosting capacitor C4 coupled between nodes N5 and N8, an N type MOS transistor QN68 having a gate connected to node N7, and provided to electrically couple nodes N9 and N8, and an N type transistor QNT having a gate connected to node N7, and provided to electrically couple nodes N7 and Nb.

By the above-described structure, node N8 is charged to the level of internal power supply potential Vcc in response to transistor QP60 being turned on according to activation of control signal φ2 and the boost of node N7, and then boosted in a pulsive manner according to the change of control signal φ4. Transistor QNT is diode-connected in the direction from node N8 to node Nb, and supplies a current to node Nb when the potential of node Nb connected to the gate of pull up transistor QNH becomes lower than the potential level of node N8.

Therefore, even in the case where the potential level of node Nb is reduced in providing an H level data output caused by generation of leakage current and the like to result in reduction of potential level Vdat of data output terminal 90, current can be supplied to node Nb by virtue of transistor QNT being turned on to have the potential level restored.

Figure 9:
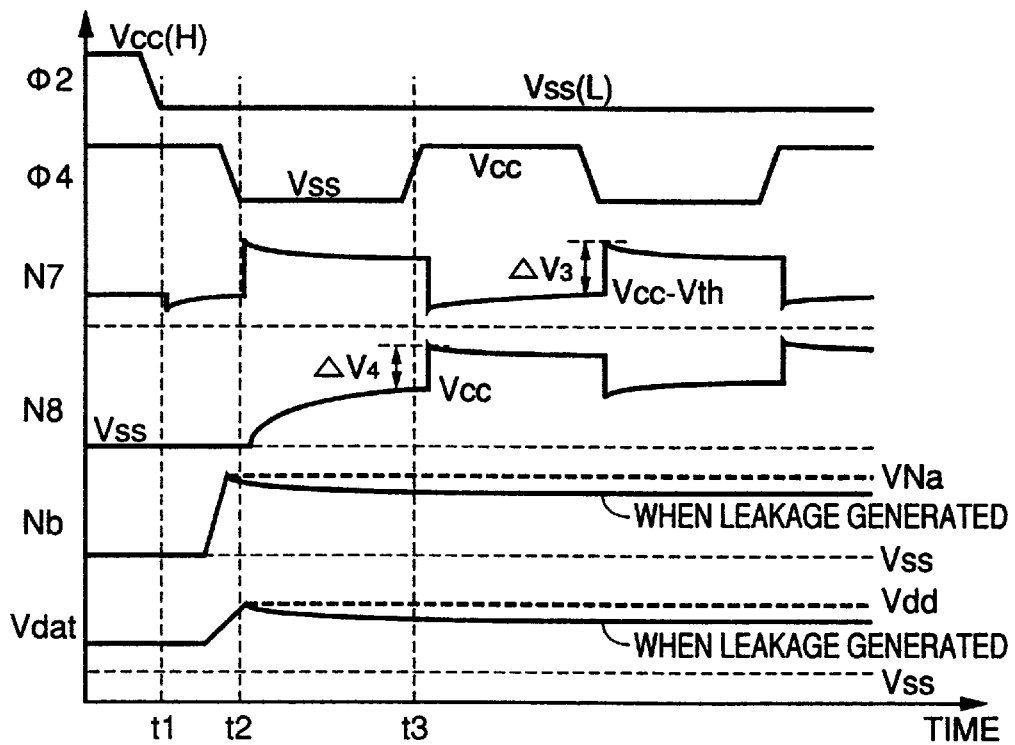
FIG. 9 is a timing chart representing an operation of boosted potential retain circuit 160.

FIG. 9 is a timing chart to describe the operation of boosted potential retain circuit 160.

Referring to FIG. 9, control signal φ2 is rendered active at time t1. In response, nodes N5 and N6 are set to a potential level corresponding to control signal φ4. Also, transistor QP60 is turned on, whereby the potential level of node N9 is driven to the level of internal power supply potential Vcc.

When control signal φ4 is driven to an L level from an H level at time t2, the potential level of node N6 is pulled up to an H level. Therefore, the potential level of node N7 corresponds to the boosted potential of boosting capacitor C3 added to the precharged level of Vcc−Vth (Vcc−Vth +ΔV3). Accordingly, transistor QN68 is turned on, whereby the potential level of node N8 begins to rise.

When control signal φ4 is pulled to an H level from an L level at time t3, the potential level of node N6 is driven to an L level from an H level. Charge is stored again in boosting capacitor C3. Since the potential level of node N6 rises from an L level to an H level, the potential level of node N8 is boosted by the charge stored in boosting capacitor C4 to attain the level of Vcc +ΔV4 from the level of Vcc. During the period in which control signal φ2 is rendered active thereafter, nodes N7 and N8 have their potential level boosted alternately in accordance with change of the state of control signal φ4.

The potential level of node N8 is boosted to a level of at least internal power supply potential Vcc. Therefore, when the potential level of node Nb becomes lower than the level of the boosted potential of node N8, transistor QNT is turned on to supply current speedily, so that the potential level of node Nb can be restored.

Thus, H level data can be output stably even in the case where leakage current is generated in node Nb.

Second Embodiment

In the second embodiment, the structure of a boosting circuit that can ensure a sufficient boosting level even under operation of a low voltage will be described.

The structure of the boosting circuit of the second embodiment is similar to that of boosting circuit 120 indicated in the first embodiment. The boosting circuit of the second embodiment is characterized in the structure of boosting capacitors C1 and C2 included in the circuit.

Figure 10A:
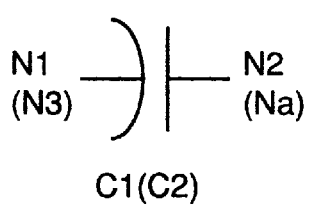
FIGS. 10A and 10B are diagrams to describe a boosting capacitor formed of an inversion N type MOS capacitor.
Figure 10B:
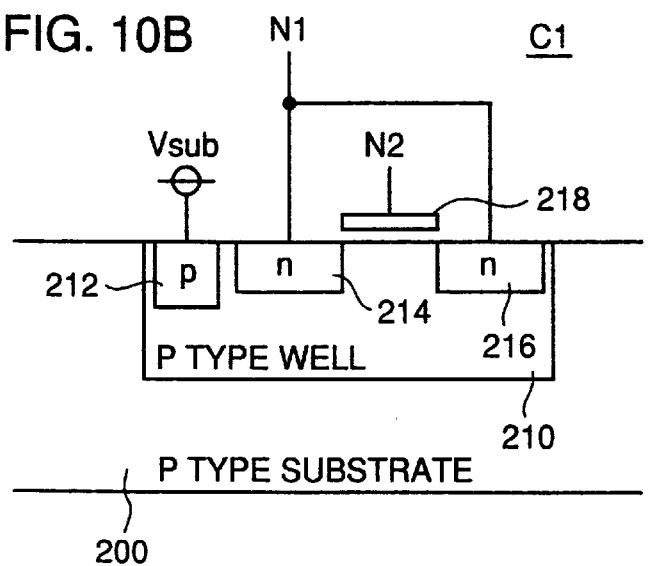

FIGS. 10A and 10B are diagrams to describe a boosting capacitor formed of an inversion type NMOS capacitor which is an example of a field effect capacitor.

Referring to FIG. 10A, the electrodes opposite to boosting capacitor C1 are connected to nodes N2 and N1, respectively. Similarly, electrodes opposite to boosting capacitor C2 are connected to nodes Na and N3, respectively.

FIG. 10B is a sectional view showing a structure of boosting capacitor C1. Here, the structure of boosting capacitor C1 will be described representative thereof.

Referring to FIG. 10B, boosting capacitor C1 includes an N type MOS transistor provided at a P type well 210 on a P type substrate region 200. Boosting capacitor C1 includes n channel regions 214 and 216 coupled to node N1, and a gate electrode 218 coupled to node N2. Substrate potential Vsub is applied to P type well 210 via a body contact 212.

As described with reference to FIG. 3, node N1 is set to the level of a low potential and node N2 is set to a level of a high potential in the case where charge for boosting is stored. Therefore, a potential of a high level is applied to gate electrode 218, and a potential of a low level is applied to the n channel region corresponding to the source/drain here.

Therefore, boosting capacitor C1 ensures the capacitance under the state where an inversion layer and a channel is formed in the region right beneath the gate. Therefore, the value of capacitance of capacitor C1 is greatly affected by threshold voltage Vth of the N type MOS transistor. Particularly in the case where the level of the potential applied to gate electrode 216 is not sufficient under the operation of a low voltage level, the capacitance value cannot be increased. As a result, the amount of charge stored in boosting capacitor C1 is reduced. Sufficient boosting potential cannot be generated.

In the second embodiment, boosting capacitors C1 and C2 in the boosting circuit are formed of an accumulation type field effect capacitor in order to solve the above problem.

In this specification, an accumulation type field effect capacitor refers to a capacitor which is formed by majority carriers in a field effect element.

The structure and operation of circuits other than the boosting circuit are similar to those of data output circuit 100 described in the first embodiment. Therefore, description thereof will not be repeated.

Figure 11A:
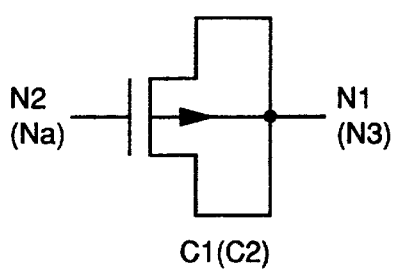
FIGS. 11A and 11B are diagrams to describe a boosting capacitor formed of an accumulation P type MOS capacitor shown as an example of an accumulation type field effect capacitor.
Figure 11B:
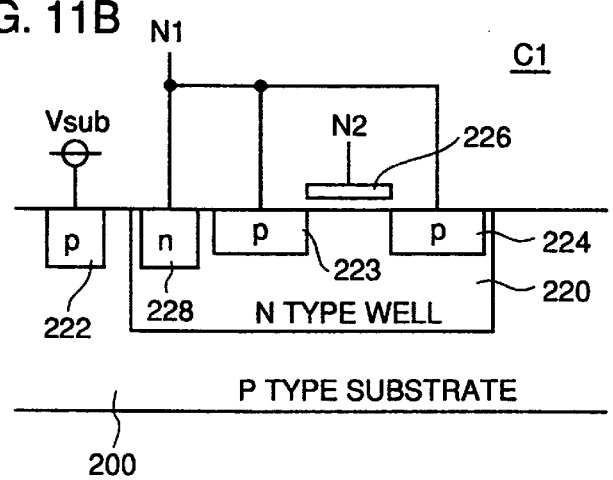

FIGS. 11A and 11B are diagrams to describe a boosting capacitor formed of an accumulation type PMOS capacitor shown as an example of an accumulation type field effect capacitor.

Referring to FIG. 11A, boosting capacitor C1 includes a source and drain connected to node N1 set to the L level potential in storing charge, and a gate connected to node N2 set to an H level in storing charge. Similarly, boosting capacitor C2 includes a source and drain connected to node N3 set to the potential of an L level in storing charge, and a gate connected to node Na set to an H level in storing charge.

In FIG. 11B, boosting capacitor C1 will be described representative thereof. Boosting capacitor C1 which is an accumulation type PMOS capacitor includes a P type MOS transistor on an N well 220 on a P type substrate region 200. This P type MOS transistor includes a gate electrode 226 connected to node N2, and P channel regions 223 and 224, corresponding to a source and drain, respectively, and connected to node N1. N type well 220 is connected to node N1 via a body contact 228.

Considering the case where the charge to boost node N2 is stored in boosting capacitor C1, node N2 is set to a potential of a high level and node N1 is set to a potential of a low level. Therefore, majority carriers (electrons) are accumulated in the region right beneath the gate of the accumulation type PMOS capacitor in the charge storing operation. The capacitance of boosting capacitor C1 is ensured by the majority carriers accumulated.

Thus, the capacitance value of boosting capacitor C1 formed of an accumulation type PMOS capacitor can be ensured impervious to threshold voltage Vth even in the operation at a low voltage.

Figure 12A:
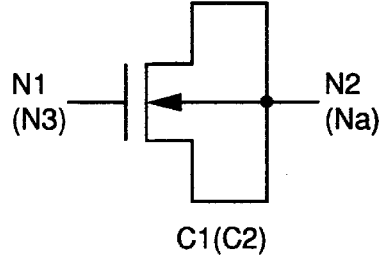
FIGS. 12A and 12B are diagrams to describe a boosting capacitor formed of an accumulation N type MOS capacitor shown as an example of an accumulation type field effect capacitor.
Figure 12B:
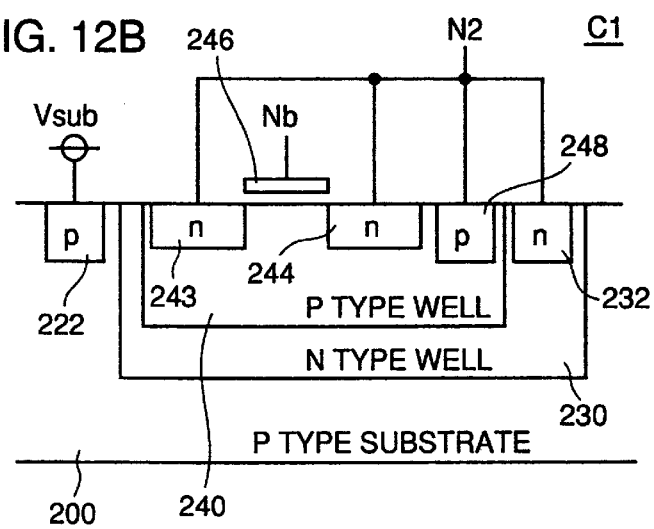

FIGS. 12A and 12B are diagrams to describe a boosting capacitor formed of an accumulation type NMOS capacitor indicated as another example of an accumulation type field effect capacitor.

Referring to FIG. 12A, boosting capacitor C1 includes a gate connected to node N1 set to the L level potential in storing charge, and a source and drain connected to node N2 set to the H level potential in storing charge. Similarly, boosting capacitor C2 includes a gate connected to node N3 set to the L level potential in storing charge, and a source and drain connected to node Na set to an H level in storing charge.

In FIG. 12B, boosting capacitor C1 will be described representative of an accumulation type NMOS capacitor. Boosting capacitor C1 includes an N type MOS transistor provided on a P channel well 240 electrically isolated from P type substrate region 200 by an N type well 230. This N type MOS transistor includes a gate electrode 246 connected to node N1, and P channel regions 243 and 244, corresponding to source and drain, respectively, and connected to node N1. P type well 240 is connected to node N2 via body contact 248.

In the case where charge for boosting node N2 is stored in boosting capacitor C1, node N1 is set to the level of a low potential, and node N2 is set to the potential of a high level. Therefore, majority carriers (holes) are accumulated at the region right below the gate in the accumulation type NMOS capacitor in storing charge. The capacitance value of boosting capacitor C1 is ensured by the majority carriers accumulated.

The capacitance value of boosting capacitor C1 formed of an accumulation type NMOS capacitor can be ensured impervious to threshold voltage Vth even under operation at a low voltage.

By using NMOS or PMOS capacitors as the accumulation type field effect capacitor, a sufficient amount of charge can be stored in the boosting capacitor under an operation at a low voltage. As a result, the boosting circuit can ensure a sufficient boosting level. Although the above description has been provided for boosting capacitor C1, the same applies for boosting capacitor C2.

Third Embodiment

In the third embodiment, a boosting operation can be carried out more speedily by altering the structure of the N type MOS transistor forming the boosting circuit.

Figure 13:
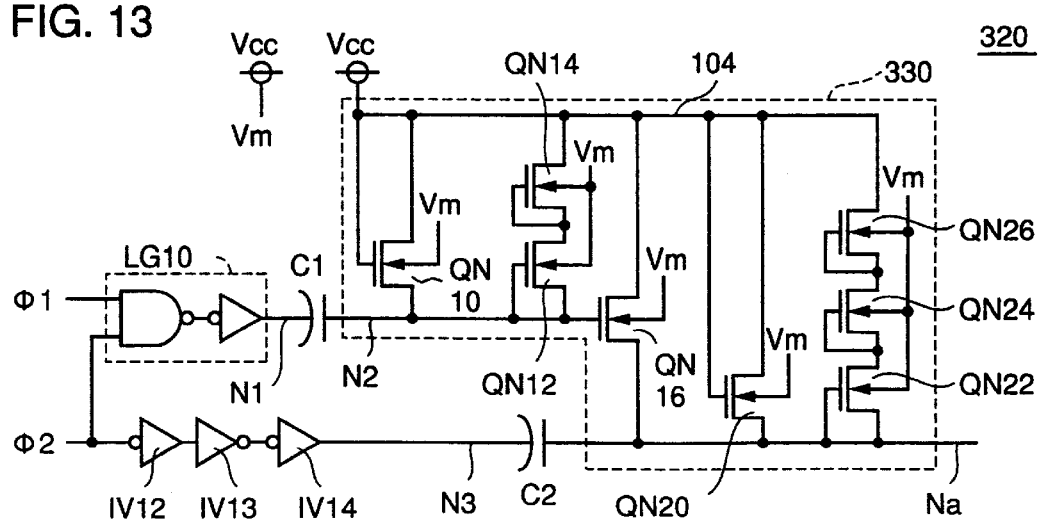
FIG. 13 is a circuit diagram showing a structure of a boosting circuit 320 according to a third embodiment of the present invention.

FIG. 13 is a circuit diagram showing a structure of a boosting circuit 320 according to a third embodiment of the present invention. Referring to FIG. 13, boosting circuit 320 has a structure similar to that of boosting circuit 120 of FIG. 3, provided that the structure of the N type MOS transistor in a region 330 surrounded by a dotted line and the potential level of substrate potential Vm are characteristic.

The structure and operation of the circuits other than the internal power supply generation circuit are similar to those of data output circuit 100 described with reference to FIG. 1. Therefore, description thereof will not be repeated.

Figure 14:
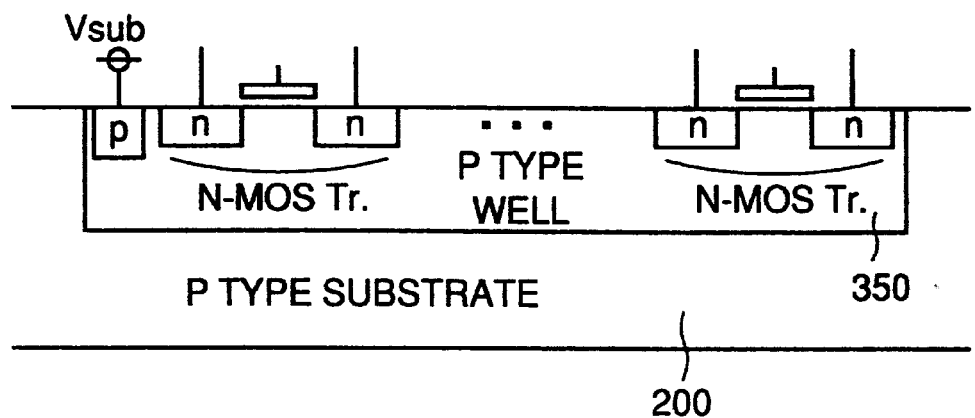
FIG. 14 is a sectional view describing a structure of an N type MOS transistor of a boosting circuit 120.

Referring to FIG. 14, these N type MOS transistors are formed on a P type well 350 on P type substrate region 200. The potential applied to P type well 350, i.e., the substrate potential applied to these N type MOS transistors, is set to the level of Vsub.

Figure 15:
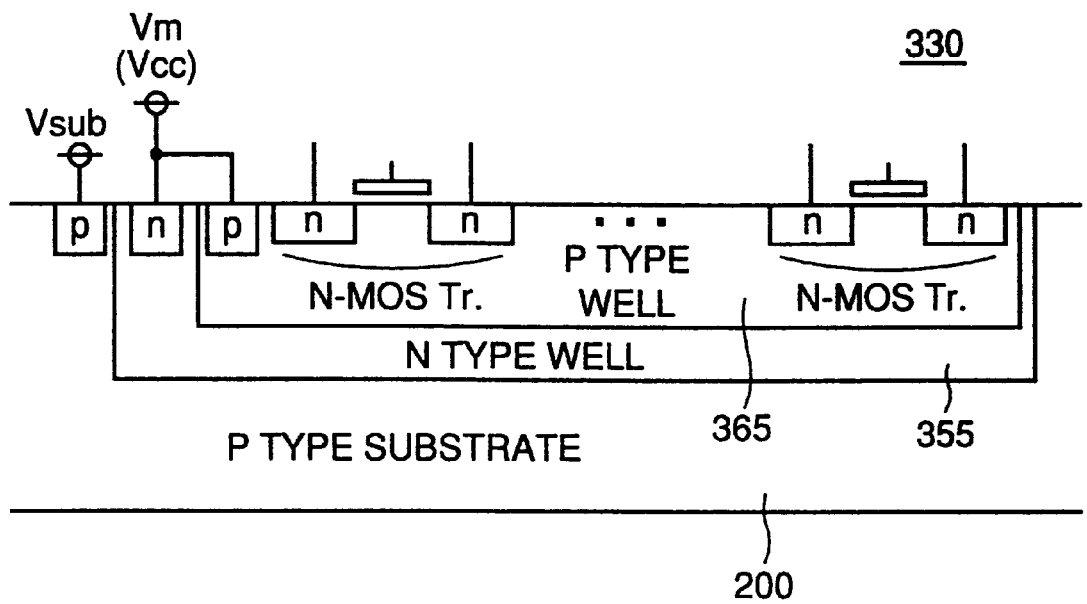
FIG. 15 is a sectional view for describing an example of a structure of an N type MOS transistor in a region 330 of a boosting circuit 320.

Referring to FIG. 15, the N type MOS transistor in region 330 shown in FIG. 13 is arranged on a P type well 365 electrically isolated from P type substrate region 200. P type well 365 is electrically isolated from P type substrate region 200 by an N type well 355.

Substrate potential Vsub is applied to P type substrate region 200. Substrate potential Vm is applied to N type well 355 and P type well 365.

By applying internal power supply potential Vcc to P type well 365 as substrate potential Vm, a current path is formed from P type well 365 to precharge nodes N2 and Na via the source electrode for transistors QN10, QN16 and QN20 in region 330.

Accordingly, nodes N2 and Nb are precharged more speedily by transistors QN10, QN16 and QN20. Thus, the boosting operation of boosting circuit 320 can be carried out more speedily.

When the purpose is aimed to only speed up the precharging operation, transistors QN10, QN16 and QN20 directly used in the precharge of these nodes can be formed on an independent P type well, and the substrate potential Vm thereof set to internal power supply potential Vcc. In the circuitry shown in FIG. 13, all the N type MOS transistors in region 330 are formed on an independent P type well taking into consideration the increase of the layout area due to formation of only some of the transistors arranged in the same region on an independent well.

If substrate potential Vm applied to P type well 365 is higher in level than ground potential Vss, the precharge operation can be further speeded. However, the upper limit of substrate potential Vm is determined so that the PN junction between P type well 365 and the N channel region of the N type channel MOS transistor is never turned on.

Accordingly, the potential level of substrate potential Vm applied to P type well 365 is set to internal power supply potential Vcc in the example of FIG. 15.

In order to electrically isolate P type well 365 from P type substrate region 200, the applied potential to N type well 355 must be determined so that the PN junction formed therebetween is not turned on. Therefore, in the example shown in FIG. 15, the applied potential of N type well 355 is set to the level of Vm (internal power supply potential Vcc) identical to the potential of P type well 365.

Fourth Embodiment

Figure 16:
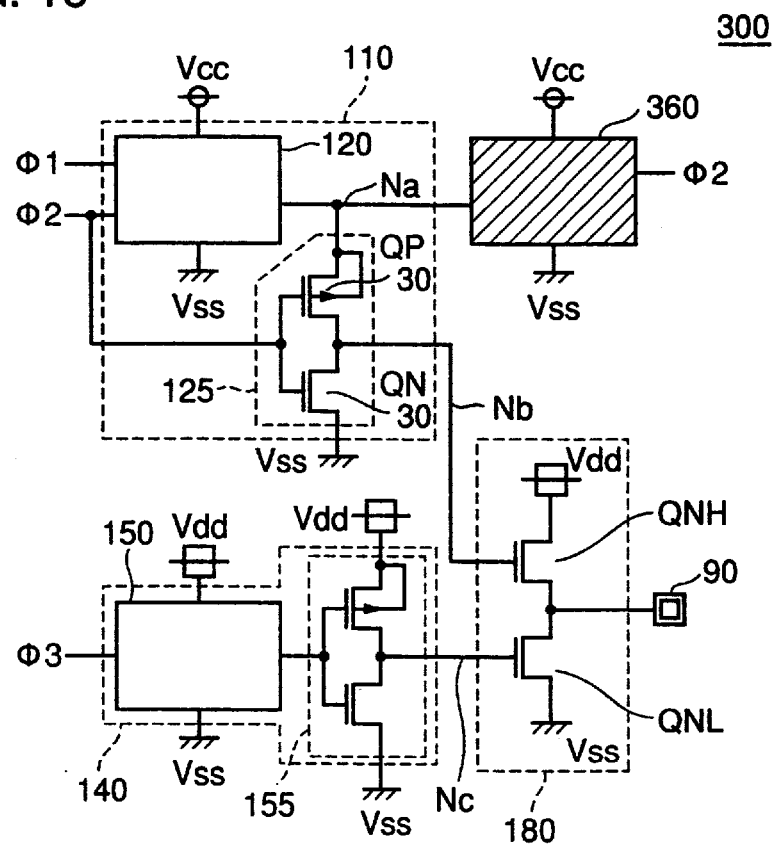
FIG. 16 is a block diagram showing an entire structure of a data output circuit 300 according to a fourth embodiment of the present invention.

Referring to FIG. 16, data output circuit 300 of the fourth embodiment differs from data output circuit 100 of the first embodiment in that boosted potential retain circuit 360 is provided instead of boosted potential retain circuit 160.

Boosted potential retain circuit 360 differs in that the potential level of node Na to which the boosted potential is provided from boosted potential output circuit 110 in an H level data output operation, not the potential level of node Nb connected to the gate of pull up transistor QNH, is retained.

The structure and operation of each circuit other than boosted potential retain circuit 360 are similar to those of data output circuit 100 of the first embodiment. Therefore, description thereof will not be repeated.

Figure 17:
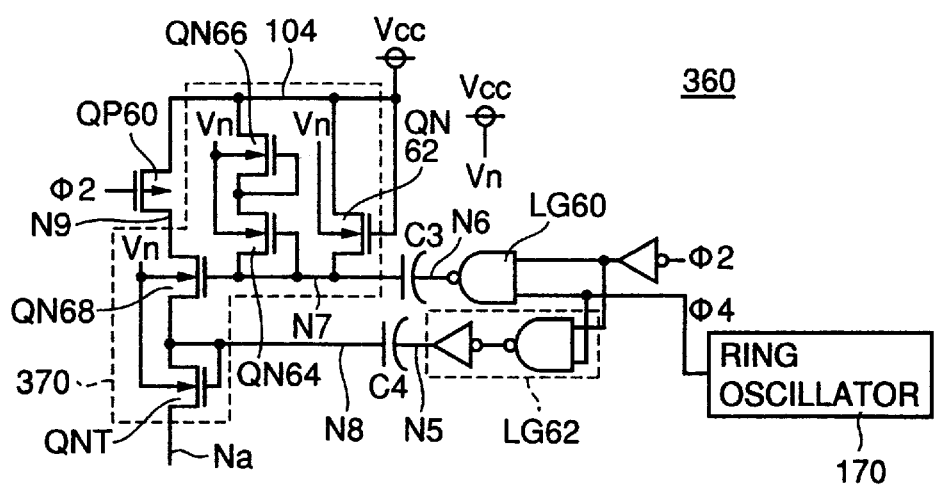
FIG. 17 is a circuit diagram showing a structure of a boosting potential retain circuit 360.

Referring to FIG. 17, boosted potential retain circuit 360 differs from boosted potential retain circuit 160 of FIG. 8 in that transistor QNT is connected between nodes N8 and Na. The remaining circuit structure is identical, and description thereof will not be repeated.

In boosted potential retain circuit 360, the structure of the N type MOS transistor included in a region 370 surrounded by a dotted line and the potential level of substrate potential Vn are characteristic.

Figure 18:
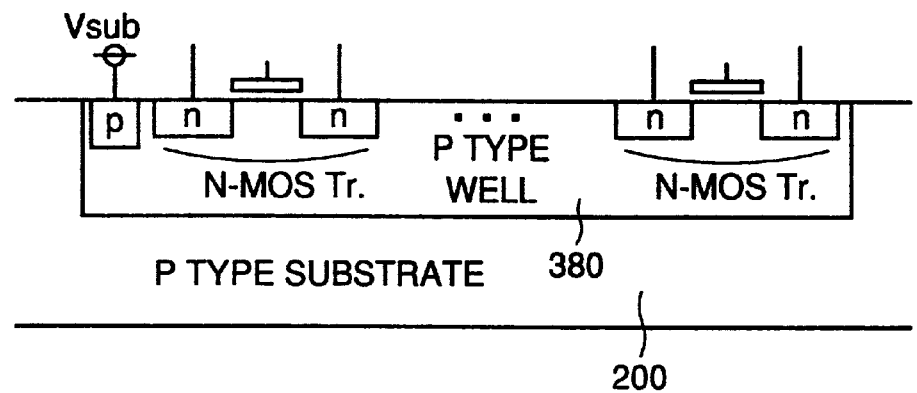
FIG. 18 is a sectional view for describing an example of the structure an N type MOS transistor in boosted potential retain circuit 160.

Referring to boosted potential retain circuit 160 of FIG. 18, the N type MOS transistor in the circuit is formed on a P type well 380 to which a substrate potential Vsub identical to that of P type substrate region 200 is applied.

Figure 19:
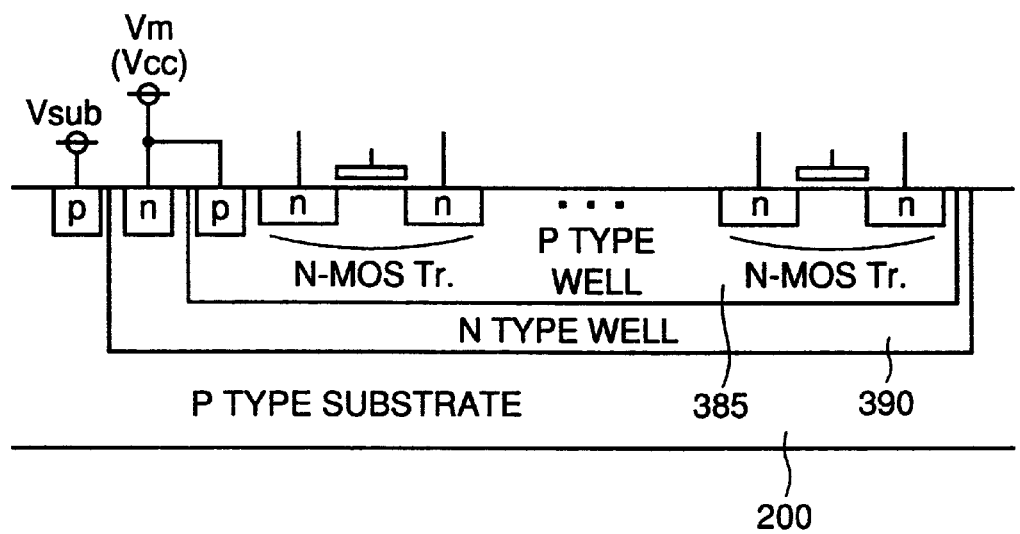
FIG. 19 is a sectional view describing a structure of an N type MOS transistor of boosted potential retain circuit 360.

FIG. 19 is a sectional view to describe a structure of the N type MOS transistor in boosted potential retain circuit 360.

Referring to FIG. 19, the N type MOS transistor provided in region 370 is formed on a P type well 385 electrically isolated from P type substrate region 200. P type substrate region 200 and P type well 385 are electrically isolated by an N type well 390.

Substrate potential Vsub is applied to P type substrate region 200. Internal power supply voltage Vcc is applied to P type well 385 and N type well 390 as substrate potential Vn. According to this structure, a circuit path is formed from P type well 380 to node N7 by the PN junction being turned on by N type MOS transistors QN62, QN68 and QNT provided on P type well 380. A precharge operation can be effected from this current path.

Accordingly, the boosting operation of nodes N7 and N8 in boosted potential retain circuit 360 can be executed more speedily to improve circuit response.

When only increase of the precharge speed is intended, transistors QN62, QN68 and QNT alone directly used for precharging those nodes are to be formed on an independent P type well, and the substrate potential Vn thereof set to internal power supply potential Vcc. The circuit of FIG. 17 has a structure in which all the N type MOS transistors in region 370 are formed on an independent P type well taking into consideration increase of the layout area due to formation of only some of the transistors arranged in the same region on an independent well.

Similar to the third embodiment, a substrate potential Vn higher than ground potential Vss to P type well 385 contributes to a high speed precharge operation. The upper limit of the applied potential is determined so that the PN junction between the P type well 385 and the N channel region in the N type channel MOS transistor is never turned on. Therefore, the level of substrate potential Vn applied to P type well 385 is set to internal power supply potential Vcc in the example of FIG. 19.

In order to electrically isolate P type well 385 from P type substrate region 100, the applied potential to N type well 390 must be determined so that the PN junction formed therebetween is not turned on. Therefore, in the example shown in FIG. 19, the applied potential of N type well 390 is set to the potential of Vn (internal power supply potential Vcc) identical to that of P type well 385.

In an H level data output operation, node Nb is electrically coupled to node Na by P type MOS transistor QP30 in potential switch circuit 125 being turned on. By retaining the potential of node Na at a level of at least a constant value, the function similar to that of boosted potential retain circuit 160 in data output circuit 100 of the first embodiment can be ensured.

By altering the potential to be retained by the boosted potential retain circuit from that of node Nb to node Na, the response of the boosting operation can be improved by setting the substrate potential of the N type MOS transistor in the circuit at a high level.

Fifth Embodiment

Figure 20:
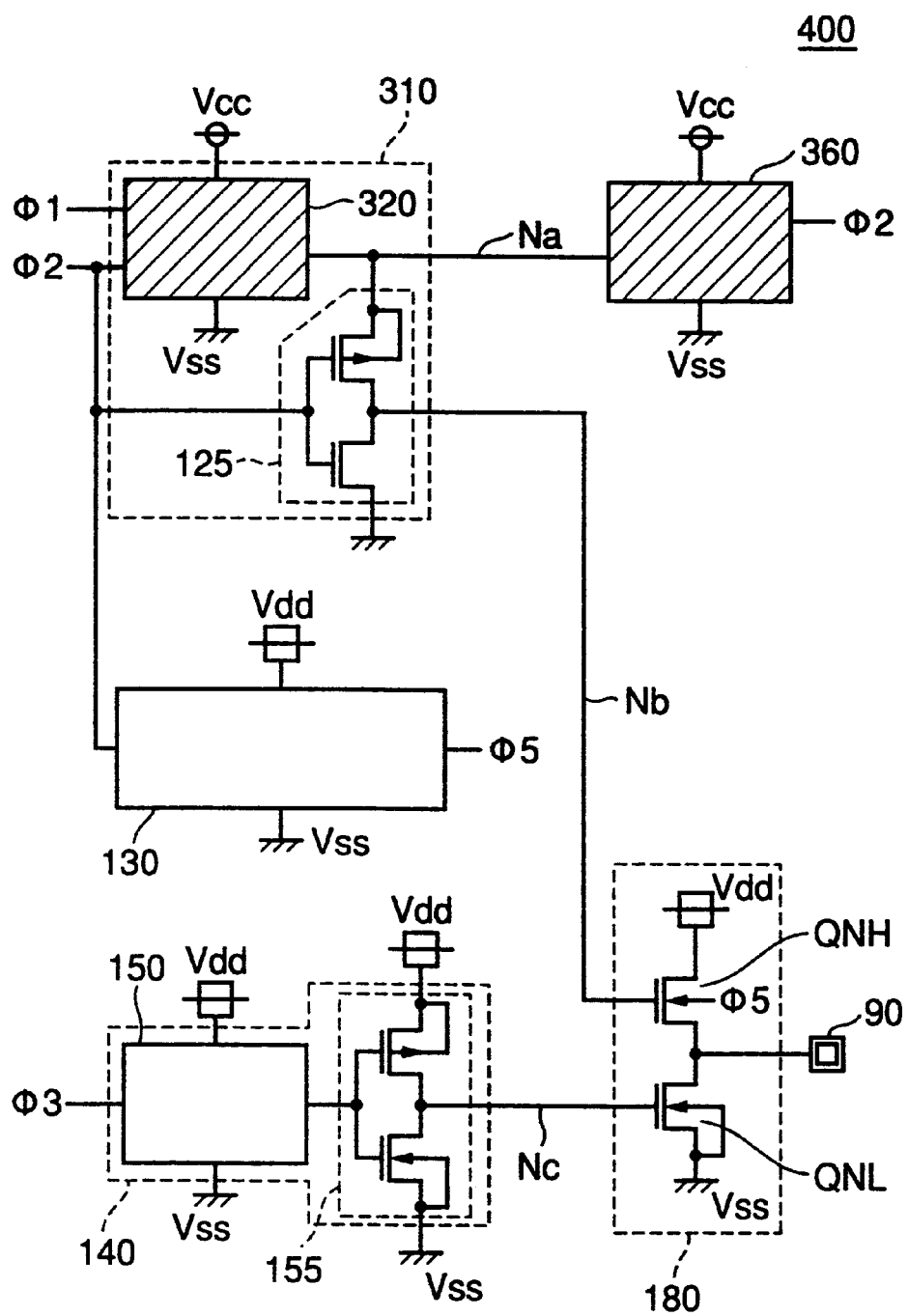
FIG. 20 is a block diagram showing an entire structure of a data output circuit 400 according to a fifth embodiment of the present invention.
Figure 21:
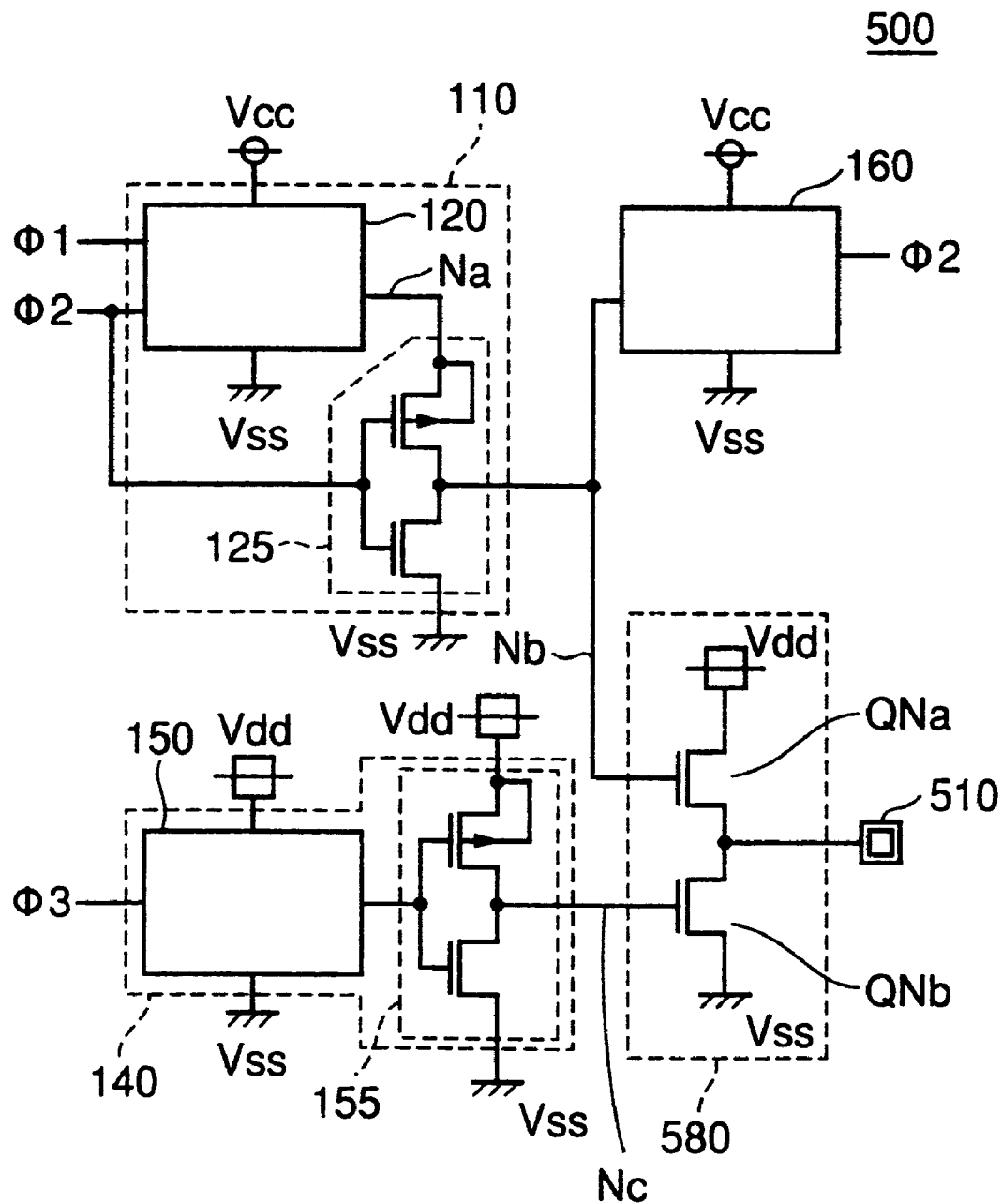
FIG. 21 is a block diagram showing a structure of a data output circuit 500 of the conventional art.
Figure 22:
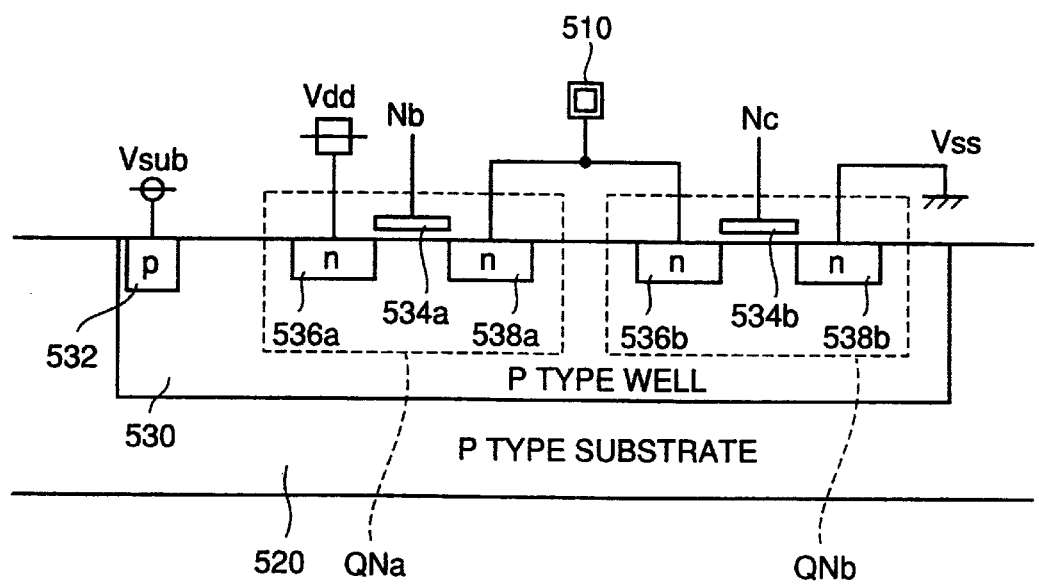
FIG. 22 is a sectional view of a structure of an output buffer 580.

FIG. 20 is a block diagram showing a structure of a data output circuit 400 according to a fifth embodiment of the present invention.

Referring to FIG. 20, data output circuit 400 includes all the technique described from the first to fourth embodiments.

Data output circuit 400 differs from data output circuit 100 of the first embodiment in that boosting circuit 320 of the third embodiment is included instead of boosting circuit 120 and boosted potential retain circuit 360 of the fourth embodiment is included instead of boosted potential retain circuit 160. Also, the accumulation type MOS capacitor described with reference to the second embodiment is employed for boosting capacitors C1 and C2 of boosting circuit 320.

The P type well in which the N type MOS transistor in region 330 in boosted potential generation circuit 320 and the N type MOS transistor provided in region 370 in boosted potential retain circuit 360 may be common or independent.

The structure and operation of each circuit are similar to those already described, so that description thereof will not be repeated. By such a structure, data output circuit 400 provides all the advantages described in the first to fourth embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A data output circuit to output a data signal having two states of a high level and a low level, comprising:

a buffer circuit setting a potential level of a data output node according to the potential levels of first and second nodes, said buffer circuit including
 a pull up transistor electrically coupled between a first potential corresponding to said high level and said data output node, and which is an N type field effect transistor having a gate coupled to said first node,
 a pull down transistor electrically coupled between a second potential corresponding to said low level and said data output node, and which is an N type field effect transistor having a gate coupled to said second node;
a high level data output control circuit providing to said first node a potential that can turn said pull up transistor on in a high level data output operation providing said high level to said data output node;
a low level data output control circuit providing to said second node a potential that can turn said pull down transistor on in a low level data output operation providing said low level to said data output node; and
a substrate potential switch circuit supplying a substrate potential to said pull up transistor, said substrate potential switch circuit supplying a first substrate potential in an operation other than said high level data output operation, and supplying a second substrate potential higher than said first substrate potential in said high level data output operation.

2. The data output circuit according to claim 1, wherein
said pull up transistor is provided on a P type well electrically isolated from a main substrate region,
said substrate potential switch circuit supplies to said P type well said first substrate potential in the operation other than said high level data output operation, and said second substrate potential in said high level data output operation,
said first substrate potential is set to the potential level at which a PN junction between said P type well and N channel regions in said pull up transistor is nonconductive.

3. The data output circuit according to claim 1, wherein said pull up transistor is provided on a P type well electrically isolated from a main substrate region,
 wherein said substrate potential switch circuit comprises
 a level conversion circuit supplying to an internal node one of said first and second potentials according to a signal level of a control signal rendered active in said high level data output operation, and
 a potential supply circuit electrically coupling one of said first and second potentials to said P type well according to the potential level of said internal node.

4. The data output circuit according to claim 1, further comprising:
 a first power supply supplying a third potential lower than said first potential and higher than said second potential; and
 a second power supply supplying said second potential;
 wherein said high level data output control circuit comprises a boosted potential generation circuit providing a boosted potential higher than said first potential according to a signal level of a control signal rendered active in said high level data output operation,
 wherein said boosted potential generation circuit comprises
 first and second logic circuits setting potential levels of first and second internal nodes, respectively, according to a signal level of said control signal,
 a first boosting capacitor electrically coupled between said first internal node and a first boosting node,
 a second boosting capacitor electrically coupled between said second internal node and a second boosting node,
 a first precharge transistor electrically coupled between said first power supply and said first boosting node, and having a gate connected to said first power supply,
 a second precharge transistor electrically coupled between said first power supply and said second boosting node, and having a gate connected to said first power supply, and
 an N type transistor electrically coupled between said first power supply and said second boosting node, and having a gate coupled to said first boosting node,
 said first and second boosting capacitors being formed of an accumulation type field effect capacitor,
 wherein said high level data output control circuit further comprises a voltage switch circuit to electrically couple one of said second boosting node and said second power supply to said first node according to a signal level of said control signal.

5. The data output circuit according to claim 4, wherein
said first boosting capacitor comprises an N type transistor including a gate connected to said first internal node, and a source and drain connected to said first boosting node,
said second boosting capacitor comprises an N type transistor including a gate connected to said second internal node, and a source and drain connected to said second boosting node.

6. The data output circuit according to claim 4, wherein
said first boosting capacitor comprises a P type transistor including a gate connected to said first boosting node, and a source and drain connected to said first internal node, and
said second boosting capacitor comprises a P type transistor including a gate connected to said second boosting node, and a source and drain connected to said second internal node.

7. The data output circuit according to claim 4, wherein
said first and second precharge transistors are N type transistors provided on a P type well electrically isolated from a main substrate region,
 wherein said first and second precharge transistors have a substrate potential set to a potential level higher than said second potential.

8. The data output circuit according to claim 1, further comprising a potential level retain circuit operating in said high level data output operation to maintain the potential of said first node at a level of at least a predetermined value.

9. The data output circuit according to claim 8, wherein said potential level retain circuit comprises
 a third internal node receiving a pulse signal repeating two potential levels under a constant frequency in said high level data output operation, one potential being a third potential lower than said first potential and higher than said second potential and the other potential being said second potential,
 a fourth internal node receiving an inverted signal of said pulse signal in said high level data output operation,
 a third boosting capacitor electrically coupled between a fifth internal node and said third internal node,
 a fourth boosting capacitor electrically coupled between a sixth internal node and said fourth internal node, a third precharge transistor electrically coupled between said third potential and said fifth internal node, and having a gate connected to said third potential, a switch circuit electrically coupling said third potential and a seventh internal node in said high level data output operation, a first N type transistor electrically coupled between said seventh internal node and said sixth internal node, and having a gate coupled to said fifth internal node, and a second N type transistor electrically coupled between said sixth internal node and said first node, and having a gate coupled to said sixth internal node.

10. The data output circuit according to claim 1, further comprising:

a first power supply supplying a third potential lower than said first potential and higher than said second potential; and a second power supply supplying said second potential;

said pull up transistor being provided on a first P type well isolated from a main substrate region, said substrate potential switch circuit supplying to said first P type well a first substrate potential in an operation other than a high level data output operation, and supplying a second substrate potential higher than said first substrate potential in said high level data output operation, wherein said high level data output control circuit comprises a boosted potential generation circuit providing a boosted potential higher than said first potential according to a signal level of a control signal rendered active in said high level data output operation, wherein said boosted potential generation circuit comprises first and second logic circuits setting potential levels of first and second internal nodes, respectively, according to a control signal rendered active in said high level data output operation, a first boosting capacitor electrically coupled between said first internal node and a first boosting node, and formed of an accumulation type field effect capacitor, a second boosting capacitor, electrically coupled between said second internal node and a second boosting node, and formed of an accumulation type field effect capacitor, a first precharge transistor electrically coupled between said first power supply and said first boosting node, and having a gate connected to said first power supply, a second precharge transistor electrically coupled between said first power supply and said second boosting node, and having a gate connected to said first power supply, and a first N type transistor electrically coupled between said first power supply and said second boosting node, and having a gate connected to said first boosting node, said first and second precharge transistors being N type transistors provided on a second P type well isolated from a main substrate region, wherein said high level data output control circuit further comprises a voltage switch circuit to electrically couple one of said second boosting node and said second power supply to said first node according to a signal level of said control signal, said data output circuit further comprising a potential level retain circuit to maintain the potential of said second boosting node at a level of at least a predetermined value in a data output operation of said high level, said potential level retain circuit including a third internal node receiving a pulse signal repeating two potential levels under a constant frequency in said high level data output operation, one potential being a third potential lower than said first potential and higher than said second potential and the other potential being said second potential, a fourth internal node receiving an inverted signal of said pulse signal in said high level data output operation, a third boosting capacitor electrically coupled between a fifth internal node and said third internal node, a fourth boosting capacitor electrically coupled between a sixth internal node and said fourth internal node, a third precharge transistor electrically coupled between said third potential and said fifth internal node, and which is an N type transistor having a gate connected to said third potential, a switch circuit connecting said third potential and a seventh internal node in said high level data output operation, a second N type transistor electrically coupled between said seventh internal node and said sixth internal node, and having a gate coupled to said fifth internal node, and a third N type transistor electrically coupled between said sixth internal node and said second boosting node, and having a gate coupled to said sixth internal node, said third precharge transistor and said second and third N type transistors being provided on one of said second P type well and a third P type well isolated from the main substrate region, wherein said second and third P type wells have a substrate potential set to a potential higher than said second potential.

11. A data output circuit to output a data signal having two states of a high level and a low level, comprising:

a buffer circuit setting a potential level of a data output node according to the potential levels of first and second node, said buffer circuit including a pull up transistor electrically coupled between a first potential corresponding to said high level and said data output node, and which is an N type field effect transistor having a gate coupled to said first node, a pull down transistor electrically coupled between a second potential corresponding to said low level and said data output node, and which is an N type field effect transistor having a gate coupled to said second node; and a high level data output control circuit providing to said first node a boosted potential higher than said first potential in a high level data output operation providing said high level to said data output node, said high level data output control circuit including a boosted potential generation circuit providing said boosted potential to a boosting node according to a signal level of a control signal rendered active in said high level data output operation, and a voltage switch circuit to electrically coupling one of said boosting node and a power supply node supplying said second potential to said first node according to a signal level of said control signal, a low level data output control circuit providing to said second node a potential that can turn said pull down transistor on in a low level data output operation providing said low level to said data output node, and a potential level retain circuit to maintain the potential of said boosting node at a level of at least a predetermined value in said high level data output operation.

12. The data output circuit according to claim 11, wherein said potential level retain circuit comprises a third internal node receiving a pulse signal repeating two potential levels under a constant frequency in said high level data output operation of said high level, one potential being a third potential lower than said first potential and higher than said second potential and the other potential being said second potential, a fourth internal node receiving an inverted signal of said pulse signal in said high level a data output operation of said high level, a first boosting capacitor electrically coupled between a fifth internal node and said third internal node, a second boosting capacitor electrically coupled between a sixth internal node and said fourth internal node, a precharge transistor electrically coupled between said third potential and said fifth internal node, and which is an N type transistor having a gate connected to said third potential, a switch circuit electrically coupling said third potential and a seventh internal node in a data output operation of said high level, a first N type transistor electrically coupled between said seventh internal node and said sixth internal node, and having a gate coupled to said fifth internal node, and a second N type transistor electrically coupled between said sixth internal node and said boosting node, and having a gate coupled to said sixth internal node, said precharge transistor and said first and second N type transistors being provided on a P type well isolated from the main substrate region, wherein a substrate potential of said P type well is set higher than said second potential.

13. The data output circuit according to claim 11, further comprising a substrate potential switch circuit supplying a substrate potential to said pull up transistor, wherein said substrate potential switch circuit supplies a first substrate potential in an operation other than said high level data output operation, and supplies a second substrate potential higher than said first substrate potential in said high level data output operation.

14. The data output circuit according to claim 13, wherein said pull up transistor is provided on a P type well electrically isolated from a main substrate region, said substrate potential switch circuit supplies to said P type well a first substrate potential in the operation other than said high level data output operation, and supplies a second substrate potential higher than said first substrate potential in said high level data output operation, and said first substrate potential is set to a potential level at which a PN junction between said P type well and N channel regions in said pull up transistor is non-conductive.

15. A semiconductor memory device to store a data signal having two states of a high level and a low level, comprising:

a memory cell array including a plurality of memory cells arranged in a matrix;

a data output circuit providing to a data output node a potential of a level according to the state of said data signal read out from one of selected said plurality of memory cells, said data output circuit including a buffer circuit setting a potential level of said data output node according to potential levels of first and second nodes, said buffer circuit including a pull up transistor electrically coupled between a first potential corresponding to said high level and said data output node, and which is an N type field effect transistor having a gate coupled to the first node, a pull down transistor electrically coupled between a second potential corresponding to said low level and said data output node, and which is an N type field effect transistor having a gate coupled to the second node, a high level data output control circuit providing to said first node a potential that can turn said pull up transistor on in a high level data output operation providing said high level to said data output node;

a low level data output control circuit providing to said second node a potential that can turn said pull down transistor on in a low level data output operation providing said low level to said data output node; and a substrate potential switch circuit supplying a substrate potential to said pull up transistor, said substrate potential switch circuit supplying a first substrate potential in an operation other than said high level data output operation, and supplying a second substrate potential higher than said first substrate potential in said high level data output operation.

16. The semiconductor memory device according to claim 15, wherein the potential provided by said high level data output control circuit is boosted higher than said first potential.

* * * * *